(12) United States Patent
Barnes et al.

(10) Patent No.: US 6,818,096 B2
(45) Date of Patent: Nov. 16, 2004

(54) PLASMA REACTOR ELECTRODE

(76) Inventors: Michael Barnes, 12215 Santa Teresa Dr., San Ramon, CA (US) 94583; David Palagashvili, 49 Showers Dr. K431, Mountain View, CA (US) 94040

( * ) Notice: Subject to any disclaimer, the term of this patent is extended or adjusted under 35 U.S.C. 154(b) by 0 days.

(21) Appl. No.: 09/834,343

(22) Filed: Apr. 12, 2001

(65) Prior Publication Data
US 2002/0150519 A1 Oct. 17, 2002

(51) Int. Cl.[7] .............................................. H01L 21/00
(52) U.S. Cl. .............................. 156/345.43; 118/723 E; 118/723 R
(58) Field of Search .............................. 118/715, 723 E, 118/723 R; 156/345.43, 345.44, 345.47

(56) References Cited

U.S. PATENT DOCUMENTS

| | | | |
|---|---|---|---|
| 5,074,456 A | | 12/1991 | Degner ........................ 228/121 |
| 5,268,034 A | * | 12/1993 | Vukelic ........................ 118/719 |
| 5,423,936 A | * | 6/1995 | Tomita et al. ........... 156/345.34 |
| 5,593,540 A | * | 1/1997 | Tomita et al. ............... 438/710 |
| 5,766,364 A | | 6/1998 | Ishida et al. |
| 5,888,907 A | * | 3/1999 | Tomoyasu et al. ........... 438/714 |
| 5,997,649 A | * | 12/1999 | Hillman ....................... 118/715 |
| 6,019,848 A | * | 2/2000 | Frankel et al. ............... 118/715 |
| 6,073,577 A | | 6/2000 | Lilleland ..................... 118/723 |
| 6,110,556 A | * | 8/2000 | Bang et al. .................. 428/64.1 |
| 6,148,761 A | * | 11/2000 | Majewski et al. ........... 118/715 |

FOREIGN PATENT DOCUMENTS

| | | | |
|---|---|---|---|
| JP | 09291366 A | * 11/1997 | ........... C23C/16/50 |
| WO | WO 01/03159 A1 | 1/2001 | |

OTHER PUBLICATIONS

*Patent Abstracts of Japan*, vol. 2000, No. 14, Mar. 5, 2001 (JP 2000 306889 A).

* cited by examiner

*Primary Examiner*—P. Hassanzadel
*Assistant Examiner*—Michelle Crowell
(74) *Attorney, Agent, or Firm*—Sughrue Mion, PLLC; Joseph Bach

(57) ABSTRACT

A plasma reactor electrode, a method of making it, and a plasma reaction chamber employing the inventive electrode, wherein the electrode is configured to provide superior thermal conductivity characteristics. In the inventive electrode, first and second plates are connected by pins. In one embodiment, the pins, and the first and second plates are made of the same material, such as aluminum. The connection of the pins through the first and second plates provides superior thermal conductivity between the first and second plates. A dielectric cover, which may be made of ceramic or quartz, may be added below the lower plate. To form a showerhead assembly, holes are formed in the lower plate, and also in the dielectric cover, in alignment with a plenum chamber, to provide appropriate inlet for process gas into the chamber.

15 Claims, 2 Drawing Sheets

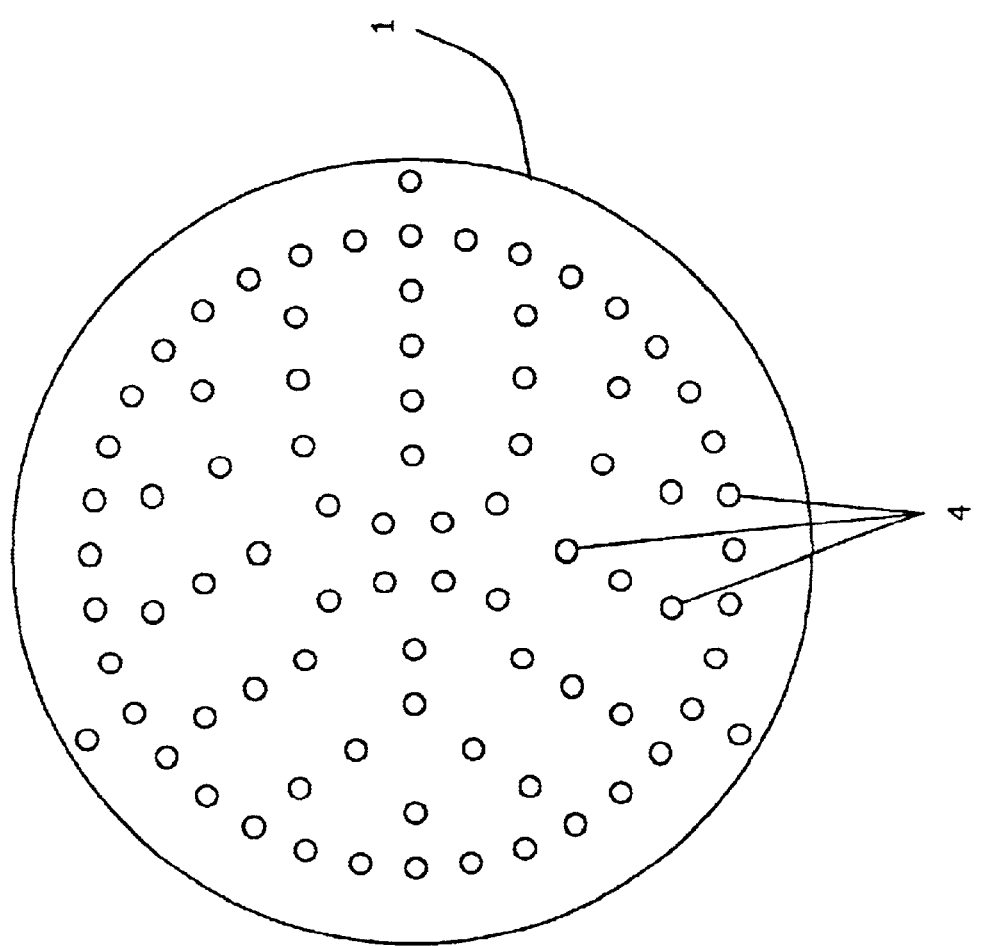

PLASMA REACTOR ELECTRODE

BACKGROUND OF THE INVENTION

The present invention relates to a plasma reactor electrode, and more particularly to a plasma reactor electrode which provides uniform cooling and consistent delivery of RF power.

Various structures of plasma reactor electrodes are known in the art. Two such structures are shown in U.S. Pat. Nos. 5,074,456 and 6,073,577. In U.S. Pat. No. 5,074,456, a silicon electrode is bonded to a support ring via brazing techniques, or through the use of a metal-filled epoxy. In U.S. Pat. No. 6,073,577, the electrode is bonded to a graphite support ring by an elastomeric joint. In both of these techniques, the silicon electrode is bonded only at one of its edges, and thus is bonded only along a limited contact surface. Such bonding creates a problem with respect to uniformity of heat transfer when RF power is delivered to the electrode.

It would be desirable to provide a plasma reactor electrode which provides more uniform transfer of heat, and which in addition transfers RF power so as to reduce voltage gradients in a showerhead assembly in which the electrode can be used.

SUMMARY OF THE INVENTION

In view of the foregoing, it is one feature of the invention to provide a plasma reactor electrode structure which avoids the above-identified deficiencies, and provides the foregoing and other advantages.

In accordance with one embodiment of the invention, an upper plate and a lower plate are connected with pins or studs, heat being transmitted from the lower plate to the upper plate at least in part via these pins or studs. This structure also provides more efficient delivery of RF power, to reduce voltage gradients in a showerhead assembly in which the electrode may be used. By reducing the voltage gradients, there is less tendency for an arc to form, or a spurious discharge.

Another feature of the invention relates to a method for fabricating such a plasma reactor electrode.

BRIEF DESCRIPTION OF THE DRAWINGS

The foregoing and other features and advantages of the invention will be apparent from the following detailed description of a preferred embodiment with reference to the following drawings, wherein:

FIG. 2 is a plan view of one of the elements of the inventive structure.

DETAILED DESCRIPTION OF A PREFERRED EMBODIMENT

Figure 1:
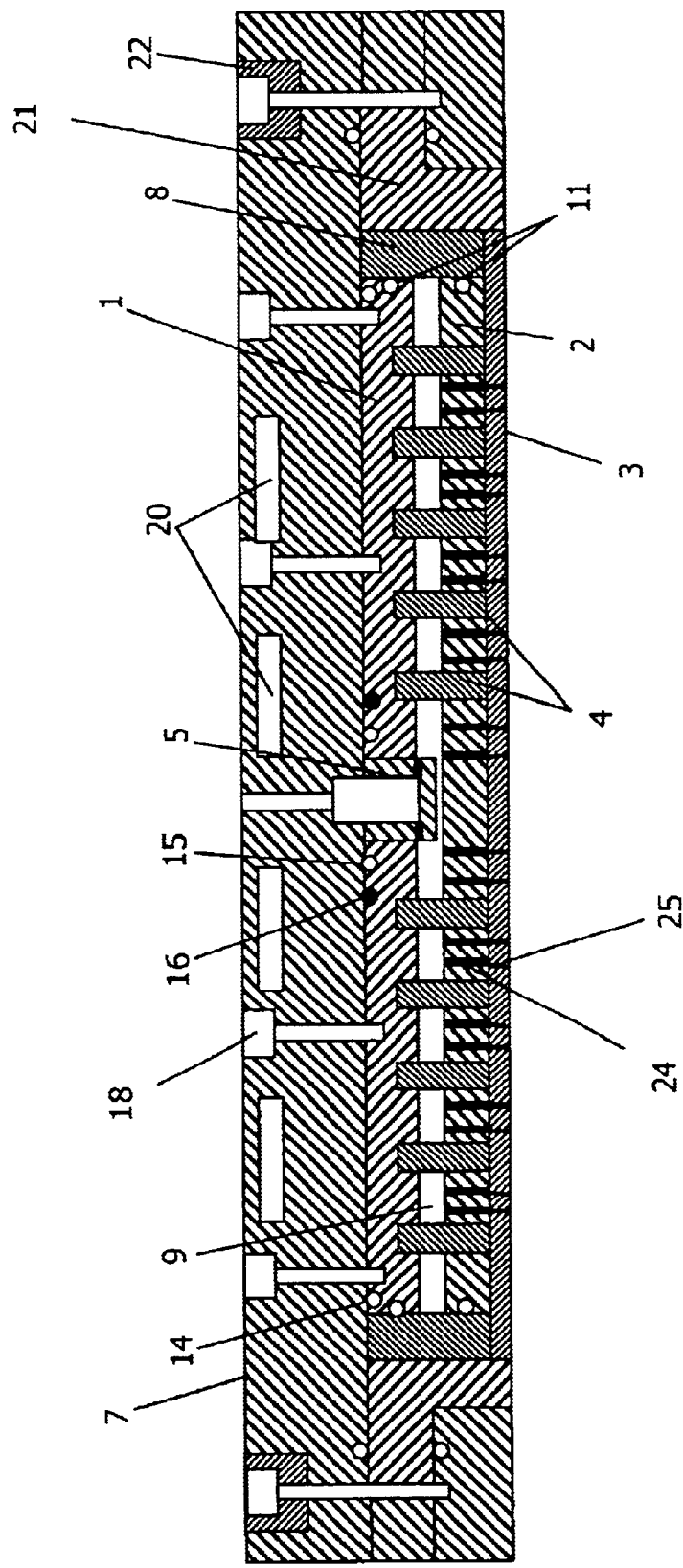
FIG. 1 is a diagram of the inventive plasma reactor electrode structure, as part of a showerhead assembly.

In FIG. 1, an upper plate 1 and lower plate 2 are connected by pins or studs 4. The plates 1 and 2 and the pins or studs 4 are made of electrically conductive material. It also is beneficial for the material to be thermally conductive, but the plates 1, 2 can be made of different materials from that used for the pins or studs 4, and indeed the plates 1, 2 can be made of different respective materials. The composition of the pins or studs 4 also promotes efficient transfer of heat between the lower plate 2 and the upper plate 1 when the electrode is in use, and RF power is applied to it.

The number of pins may be selected, depending on the application, to provide an appropriate balance or mix of heat transfer and power transfer. Consideration as to the number of pins to be selected, and as to placement of those pins, should be based on desired thermal and electrical conductivity characteristics. Such characteristics are well known to those of ordinary skill in this technological field, and so need not be detailed here.

In accordance with one embodiment of the invention, the upper and lower plates 1, 2, as well as the pins or studs 4, may be made of aluminum, but other electrically conductive materials having suitable heat transfer characteristics may be selected.

Also in the figure, a protective plate 3, which is a dielectric cover which may be made of ceramic or quartz, may be bonded to lower plate 2. An outer ring 8, which may be made of insulating material such as ceramic or quartz, surrounds the two plates 1, 2. O rings 11 are provided between the upper plate 1 and the outer ring 8, and between the lower plate 2 and the outer ring 8, respectively. As a result, an interior plenum chamber 9 is formed between the upper and lower plates 1, 2.

A lid 7, which also is electrically conductive, and may be made of aluminum or other suitable electrically conductive material, is provided with cooling channels 20, and overlies the assembly of upper plate 1, lower plate 2, and pins or studs 4. O rings 14, 15 are provided between lid 7 and upper plate 1, to provide a vacuum seal between the lid 7 and plate 1. An RF gasket 16 provides a seal around the inlet for processed gas. In addition, attachment bolts 18 attach lid 7 to upper plate 1. Plenum chamber 9 and insert 5 provide gas distribution that is adequate for wafer processing, with the necessary non-uniformity in that distribution.

A further outer ring 21 surrounds outer ring 8. Attachment bolts 22 attach outer ring 21 to lid 7.

In operation, RF energy is applied to lid 7, and then is transmitted to upper plate 1 through RF gasket 16. Via the pins or studs 4, the RF energy then is transmitted to lower plate 2, so as to cause plasma to be created below protective plate 3.

Preferred materials for the lid 7, plates 1 and 2, and pins or studs 4 include electrically and thermally conductive materials. The insertion of the pins 4 in plates 1 and 2 is done through shrink fitting. That is, the pins first are shrunk by reducing their temperature, so that they then fit in the holes in plates 1 and 2. When the pins 4 warm up, they then provide a snug fit within the holes in plates 1 and 2.

Thermal energy created as a result of the plasma process is applied to protective plate 3, then through the upper plate 1, pins or studs 4, and lower plate 2 to the actively cooled lid 7. The protective plate 3 is bonded to the lower plate 2 over its entire surface, except for a small area around holes 24 in lower plate 2, and corresponding holes 25 in protective plate 3. As a result, the expected temperature non-uniformity is within 10° C. As such, the degree of temperature non-uniformity represents a great improvement over the design disclosed in U.S. Pat. No. 6,073,577, for example.

FIG. 2 is a plan view of plate 1, showing one example of locations for pins 4 that extend between plates 1 and 2. This configuration is one way to accomplish appropriate thermal and electrical conductivity, including appropriate transfer of RF power from plates 1 to plate 2; other suitable configurations will be readily apparent to those of ordinary skill in the art, and so need not be detailed here.

From the foregoing, it will be appreciated by those of ordinary skill in the art that the inventive electrode design provides superior uniformity of heat transfer through the provision of metal pins which connect the upper and lower plates. These pins distribute heat uniformly across the plates, in contrast to designs such as that in U.S. Pat. Nos. 6,073,577 and 5,074,456, in which heat transfer is done via a supporting ring, thus providing a greatly reduced amount of surface area provided for heat transfer in comparison with the invention.

While the invention has been described with reference to a preferred embodiment, various modifications within the scope and spirit of the invention will be apparent to those of working skill in this technological field. Accordingly, the scope of the invention is to be measured by the appended claims.

What is claimed is:

1. A plasma reactor electrode comprising:
   a first, upper plate for the transfer of RF energy, said upper plate being made of electrically conductive material, and having a first plurality of holes cut into it;
   a second, lower plate for the transfer of RF energy, said lower plate being made of electrically conductive material, and having a second plurality of holes cut into it; and
   a plurality of pins inserted into the respective first and second pluralities of holes to connect the upper and lower plates, said pins being made of a thermally conductive material to facilitate thermal conductivity during RE energy transfer;
   wherein said upper and lower plates are connected with said pins to form a plenum chamber.

2. An electrode as claimed in claim 1, further comprising a dielectric cover disposed below the lower plate.

3. An electrode as claimed in claim 2, wherein said dielectric cover is bonded to said lower plate.

4. An electrode as claimed in claim 1, wherein said electrode is part of a showerhead assembly, with holes extending through said lower plate and said cover.

5. An electrode as claimed in claim 1, further comprising an outer ring surrounding said upper and lower plates; a first O ring disposed between said upper plate and said outer ring; and a second O ring disposed between said lower plate and said outer ring;
   wherein said first and second O rings, said outer ring, and said first and second plates are configured to form said plenum chamber, and
   wherein a plurality of holes are formed to provide uniform gas distribution in conjunction with said plenum chamber.

6. An electrode as claimed in claim 2, wherein said dielectric cover is made of a material selected from the group consisting of ceramic and quartz.

7. An electrode as claimed in claim 5, wherein said outer ring comprises a material selected from the group consisting of ceramic and quartz.

8. An electrode as claimed in claim 1, further comprising a lid disposed over said upper plate.

9. An electrode as claimed in claim 8, wherein said lid is made of aluminum.

10. An electrode as claimed in claim 1, wherein said plurality of pins comprise aluminum, and said upper and lower plates comprise aluminum.

11. A plasma reaction chamber comprising:
    a chamber; and
    a plasma reactor electrode, said electrode comprising:
    a first, upper plate for the transfer of RF energy, said upper plate being made of electrically conductive material, and having a first plurality of holes cut into it;
    a second, lower plate for the transfer of RF energy, said lower plate being made of electrically conductive material, and having a second plurality of holes cut into it; and
    a plurality of pins inserted into the respective first and second pluralities of holes to connect the upper and lower plates, said pins being made of a thermally conductive material to facilitate thermal conductivity during RF energy transfer;
    wherein said upper and lower plates are connected with said pins to form a plenum chamber.

12. A chamber as claimed in claim 11, further comprising an outer ring surrounding said upper and lower plates, and respective O rings between said upper plate and said outer ring, and said lower plate and said outer ring, so as to form said plenum chamber with said upper and lower plates, said outer ring, and said O rings.

13. A chamber as claimed in claim 11, further comprising a dielectric cover attached to said lower plate.

14. An electrode as claimed in claim 1, wherein the plenum chamber makes the gas distribution non-uniform.

15. A chamber as claimed in claim 11, wherein the plenum chamber makes the gas distribution non-uniform.

* * * * *